(12) United States Patent
Jenkins, IV et al.

(10) Patent No.: US 6,788,097 B1
(45) Date of Patent: Sep. 7, 2004

(54) SECURITY IMPROVEMENTS FOR PROGRAMMABLE DEVICES

(75) Inventors: Jesse H. Jenkins, IV, Danville, CA (US); Shankar Lakkapragada, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/427,201

(22) Filed: Apr. 30, 2003

(51) Int. Cl.[7] .............................................. H03K 19/00
(52) U.S. Cl. ............................... 326/8; 326/14; 326/41; 326/37
(58) Field of Search ............................. 326/37, 38, 41, 326/8, 14

(56) References Cited

U.S. PATENT DOCUMENTS 4,879,688 A * 11/1989 Turner et al. .......... 365/185.22

6,172,518 B1   1/2001 Jenkins, IV et al.

OTHER PUBLICATIONS

"The Programmable Logic Data Book", 1998, available from Xilinx, Inc. 2100 Logic Drive, San Jose, CA 95124, pp. 3–5 to 3–19.

* cited by examiner

Primary Examiner—Anh Q. Tran
(74) Attorney, Agent, or Firm—William L. Paradice, III; Justin Liu (57) ABSTRACT

A programmable logic device includes a function block to generate a power control signal that is distributed on a rail to selectively power down various components on the device. The rail is coupled to an observation pin to allow for external observation of the power control signal. The power control signal is also provided as a feed forward signal to an input signal blocking circuit, which selectively enables or disables the device input pins in response to the feed forward signal. The feed forward signal is not accessible from the observation pin, and therefore cannot be externally altered from the observation pin.

35 Claims, 10 Drawing Sheets

SECURITY IMPROVEMENTS FOR PROGRAMMABLE DEVICES

FIELD OF INVENTION

This invention relates generally to programmable logic devices and specifically to improving security for programmable logic devices.

DESCRIPTION OF RELATED ART

Programmable logic devices (PLDs) are a class of integrated circuits which can be programmed by a user to implement user-defined logic functions. Early PLDs included an AND array which logically ANDs two or more input signals to produce product terms (P-terms), and an OR array which logically ORs two or more of the P-terms provided by the AND array to generate a sum-of-products term. A complex programmable logic device (CPLD) incorporates several early PLDs and associated connection circuitry onto a single integrated circuit.

Typically, a CPLD includes a plurality of function blocks that are selectively connected to one another and to input/output (I/O) modules by a programmable interconnect matrix. Each function block includes an AND array and a set of macrocells. The AND array includes a set of input lines for receiving selected input signals from the programmable interconnect matrix, and a set of product term (P-term) lines for transmitting P-term signals to the macrocells. Each macrocell includes an OR gate which is programmable to receive one or more of the P-term signals transmitted on the P-term lines. The OR gate produces a sum-of-products term that may be selectively transmitted to the I/O modules, to the interconnect matrix, or to adjacent macrocells.

One problem with conventional PLDs is that the input AND array in each function block consumes electric power at all times, even when the input signals are not changing. This power management problem has been addressed by Jenkins, Seltzer, and Curd in U.S. Pat. No. 6,172,518, incorporated herein by reference, which discloses a power management scheme that may selectively power down individual PLD components with minimal performance degradation. More specifically, this power management scheme designates a function block to generate a power control signal (VENA) that may be used to selectively power down the function blocks and the I/O modules. The power control signal VENA may also be used to force selected device input pins to a static state during in-system programming (ISP) operations. Typically, the signal VENA is distributed through the PLD by a power control rail, which in turn is coupled to an external device pin to allow users to externally observe the signal VENA.

Figure 1:
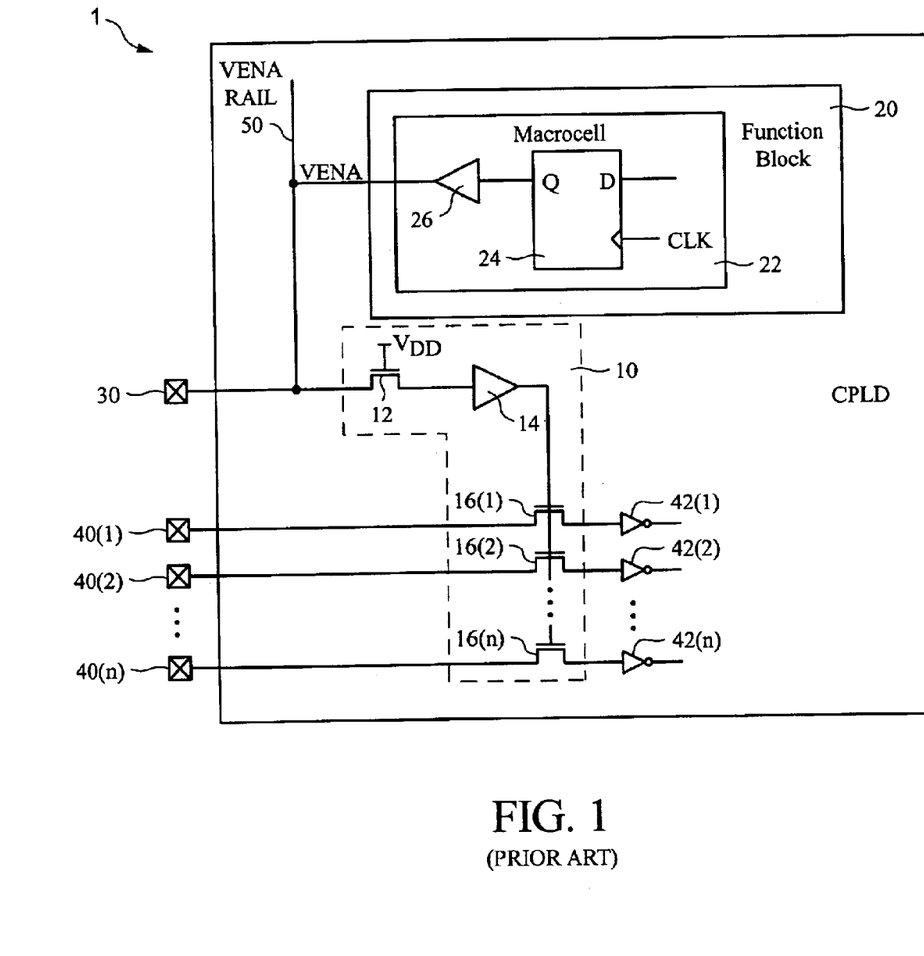
FIG. 1 is a schematic diagram of a prior art input signal blocking circuit of a PLD.

In addition, the signal VENA may be used to disable the input pins of a PLD, as described below with respect to the well-known CPLD 1 shown in FIG. 1. CPLD 1 is shown to include an input signal blocking circuit 10, a function block 20, an observation (VENA) pin 30, a plurality of input pins 40(1)–40(n) and corresponding input buffers 42(1)–42(n), and a power control (VENA) rail 50. Input signal blocking circuit 10 includes a datagate 12, a buffer 14, and a plurality of NMOS input pass transistors 16(1)–16(n). Datagate 12 is an NMOS pass transistor having a gate coupled to a supply voltage $V_{DD}$, and buffer 14 may be any suitable driver circuit. Input pass transistors 16(1)–16(n) are coupled between respective input pins 40(1)–40(n) and input buffers 42(1)–42(n). Input buffers 42(1)–42(n) are typically CMOS inverters. Function block 20, which is shown to include a well-known macrocell 22 having a flip-flop 24 and buffer 26, is designated as a control function block to generate the signal VENA in a well-known manner as described, for example, in U.S. Pat. No. 6,172,518. The signal VENA is output from macrocell 22 onto VENA rail 50, which in turn provides VENA to the gates of input pass transistors 16(1)–16(n) via datagate 12 and buffer 14.

When VENA is de-asserted (e.g., to logic high) by function block 20, input pass transistors 16(1)–16(n) are conductive and allow input signals provided on input pins 40(1)–40(n) to pass to corresponding input buffers 42(1)42(n), which in turn route the input signals to internal PLD logic (not shown). Conversely, when VENA is asserted (e.g., to logic low), input pass transistors 16(1)–16(n) are not conductive and prevent input signals provided on input pins 40(1)–40(n) from passing to corresponding input buffers 42(1)–42(n), thereby disabling input pins 40(1)–40(n).

The observation pin 30 is connected to VENA rail 50 to allow for external observation of the signal VENA. In this manner, a user may monitor observation pin 30 to determine whether selected PLD elements (e.g., function blocks, I/O modules, and input pins) are powered down and/or disabled when the signal VENA is asserted. Unfortunately, observation pin 30 may be used to circumvent the input pin disabling feature of PLD 1 by forcing VENA to a desired state.

For example, in secure applications where a register in the PLD is used to store an access key, a user may be prompted to enter a password through input pins 40 to access the PLD or to access a host system (for example, a cellular phone, personal digital assistant, or other device) which includes the PLD. Typically, the password is provided by the user on input pins 40 and compared to the key stored in the PLD. If there is a match, VENA may be de-asserted to enable input pins 40, and if there is not a match, VENA may remain asserted to disable input pins 40. However, a user having knowledge of observation pin 30's connection to VENA rail 50 may be able to drive pin 30 with sufficient strength to force VENA to a de-asserted state, irrespective of whether function block 20 has de-asserted VENA (e.g., in response to a valid password). In this manner, observation pin 30 may be used to override VENA and thus breach the security of the PLD and/or its host system.

Therefore, there is a need for an input pin signal blocking circuit that allows for external observation of the power control signal VENA without being vulnerable to security overrides using the observation pin.

SUMMARY

A method and apparatus are disclosed that prevent a user from overriding a power control signal from an observation pin. In accordance with one embodiment of the present invention, a function block of a PLD that generates the power control signal provides the power control signal to a distributed power control rail, which in turn is externally observable from an observation pin. The function block also provides the power control signal as a feed forward signal to an input signal blocking circuit. In response to the feed forward signal, the input signal blocking circuit selectively controls the device input pins. For one embodiment, an asserted feed forward signal causes the input signal blocking circuit to disable the input pins, and a de-asserted feed forward signal causes the input signal blocking circuit to enable the device input pins.

For some embodiments, the input signal blocking circuit includes a plurality of input pass transistors, each coupled between a corresponding device input pin and internal PLD logic and having a gate to receive the feed forward signal. For other embodiments, the feed forward signal is selectively provided to the input pass transistors via logic gates in response to corresponding control bits. For still other embodiments, the power control signal on the distributed rail may be selected to control the device input pins via the input pass transistors.

The feed forward signal is not accessible from the external observation pin, and therefore cannot be externally altered (e.g., overridden) from the observation pin by a user attempting to circumvent the input pin disabling mechanism. In this manner, embodiments of the present invention provide improved PLD security while allowing the state of the power control signal to be externally observed.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are discussed below in the context of a CPLD 100 for simplicity only. It is to be understood that embodiments of the present invention are equally applicable to other CPLD or PLD architectures. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may he shown as buses or as single signal lines. Each of the buses may alternatively be a single signal line, and each of the single signal lines may alternatively be a bus. Further, the logic levels assigned to various signals in the description below are arbitrary and, thus, may be modified (e.g., reversed polarity) as desired. Accordingly, the present invention is not to be construed as limited to specific examples described herein but rather includes within its scope all embodiments defined by the appended claims.

Figure 2:
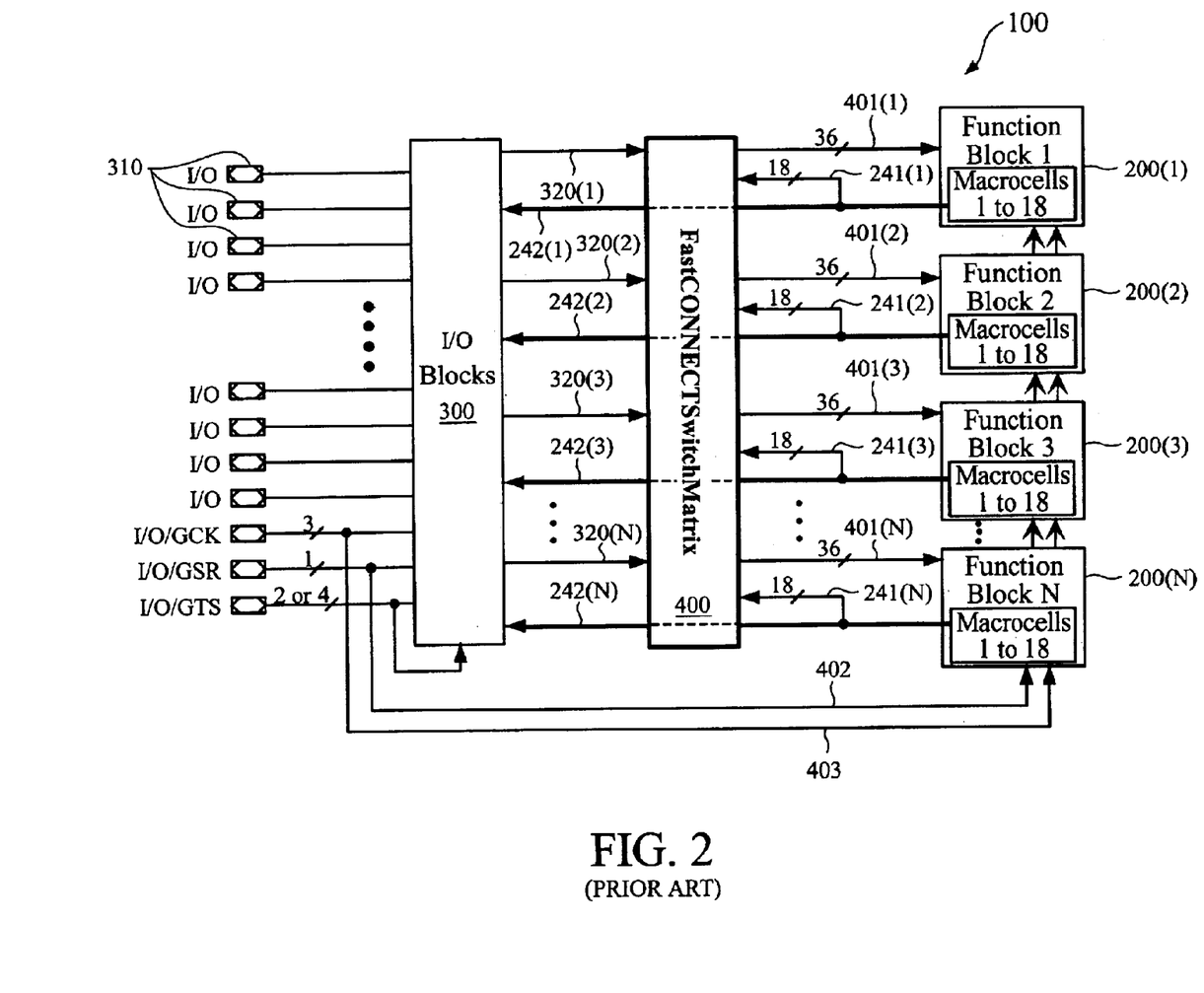
FIG. 2 is a high level block diagram of a PLD within which embodiments of the present invention may be implemented.

FIG. 2 is a block diagram of a CPLD 100 which includes features common to the xC9500 PLD series available from Xilinx, Inc. of San Jose, Calif. and described, for example, at pages 3–5 through 3–19 of the 1998 Programmable Logic Data Book, published by Xilinx, Inc., and incorporated herein by reference. PLD 100 includes a plurality of multiple function blocks 200(1)–200(N) and input/output (I/O) modules (blocks) 300 which are interconnected by a FastCONNECT™ Switch Matrix (FSM) 400. I/O modules 300 provide buffering for device inputs and outputs which are applied to input/output (I/O) pins 310, also referred to as functional pins. All input signals from the I/O modules 300 enter FSM 400 via FSM input lines 320(1)–320(N). Output signals from function blocks 200 are either fed back into FSM 400 on macrocell feed forward lines 241(1)–241(N) or transmitted to I/O modules 300 on macrocell output lines 241(1)–242(N). Each function block 200 receives thirty-six input signals on function block input lines 401(1)–401(N) from FSM 400, and produces ninety product term (P-term) elements which are applied to any of eighteen macrocells, each macrocell being programmable to provide a sum-of-products term from selected P-term elements. For each function block 200, twelve to eighteen outputs are selectively transmitted on macrocell output lines 242 to directly drive I/O modules 300, along with optional corresponding output enable signals. In addition, each function block 200 selectively receives a global set/reset signal and global clock signals on global set/reset line 402 and global clock lines 403, respectively.

Figure 3:
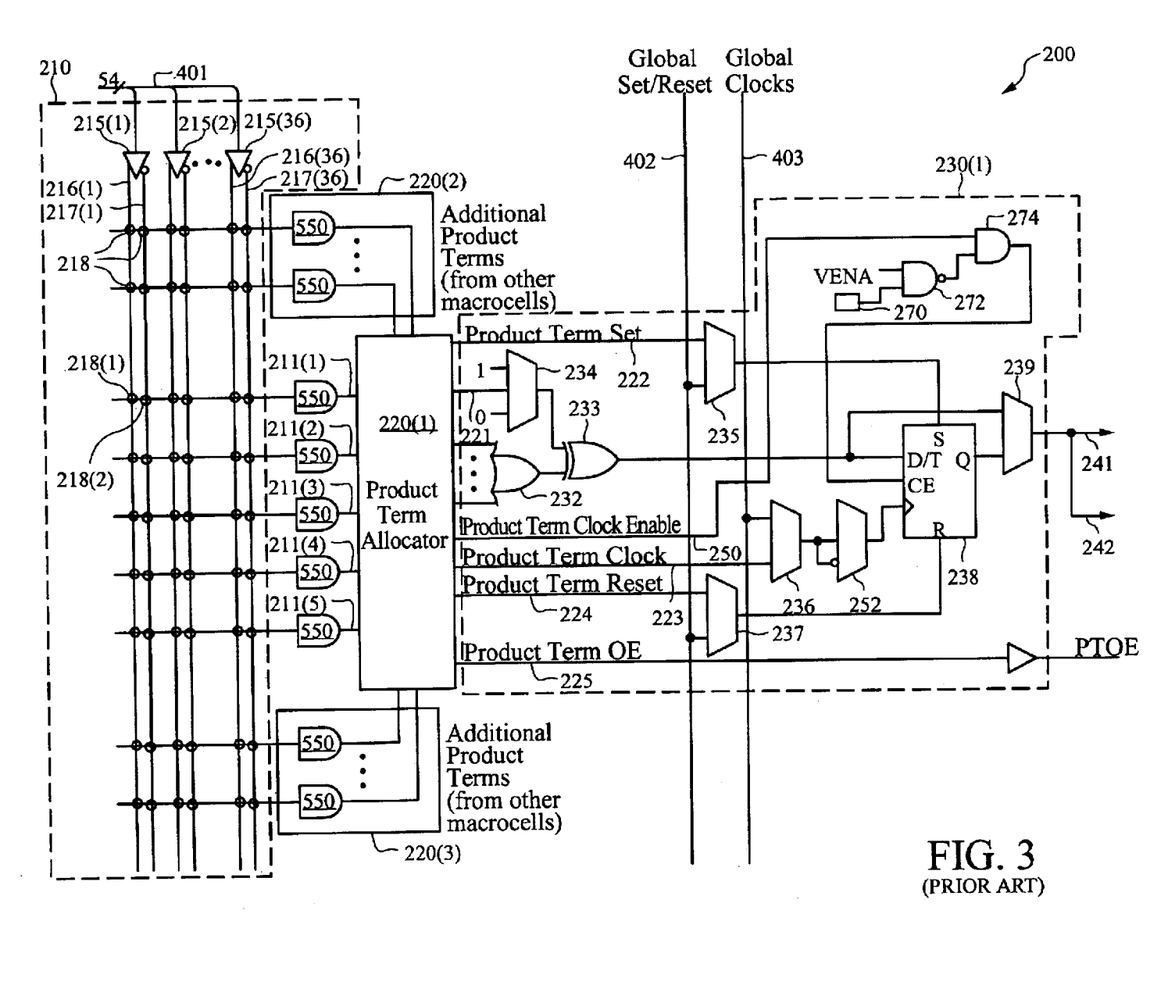
FIG. 3 is a simplified schematic diagram of a portion of a function block of the PLD of FIG. 2.

FIG. 3 is a simplified schematic diagram showing a portion of one exemplary function block 200 of PLD 100. Function block 200 includes an AND array 210, P-term buffers 550, product term allocators 220 and macrocells 230 (only one macrocell 230(1) is shown). Function block 200 includes a selectively programmable signal inversion circuit for inverting output signals from FSM 400 such that each FSM output signal is selectively transmitted to a subsequent P-term in either true (e.g., non-inverted) or complement (e.g., inverted) form. For the PLD 100, the selectively programmable signal inversion circuits are implemented by AND array 210. AND array 210 receives thirty-six input signals on input lines 401 from FSM 400 such that each input signal is applied to one of thirty-six buffers 215(1)–215(36). Each buffer 215(1)–215(36) outputs a true signal on an associated true AND-array line 216(1)–216(36), and a complement signal on an associated complement AND-array line 217(1)–217(36). Each of the true AND-array lines 216(1)–216(36) and complement AND-array lines 217(1)–217(36) is programmably connectable to each P-term buffer 550 and thus to a corresponding P-term line 211 via a programmable connection 218.

For example, true AND-array line 216(1) is connectable to P-term line 211(1) by programming a memory cell (not shown for simplicity) associated with programmable connection 218(1). Alternatively, complement AND-array line 217(1) is connectable to P-term line 211(1) by programming a memory cell (not shown for simplicity) associated with programmable connection 218(2). By selectively connecting the AND-array line (216 or 217) associated with a particular input signal, a user controls the polarity of the signal applied to a selected P-term line 211. Of course, other selectively programmable signal inversion circuits may be used in place of the AND array/P-term line connection described above.

Eighteen product term allocators 220 programmably connect the ninety P-term lines 211 to the eighteen macrocells 230 of function block 200. In particular, product term allocators 220 programmably connect five direct P-term lines 211 and up to eighty-five imported P-term lines 211 to a selected macrocell 230. For example, product term allocator 220(1) is programmable to connect P-term lines 211(1)–211(5) to OR gate 232, to exclusive-OR (XOR) gate 233 on XOR multiplexer [MUX] line 221 and XOR MUX 234, to Set MUX 235 via P-term set line 222, to Clock MUX 236 via P-term clock line 223, or to Reset MUX 237 via P-term reset line 224. Product term allocator 220(1) can also be programmed to provide an optional output enable (OE) signal via P-term output-enable line 225. In addition, product term allocator 220(1) selectively applies imported P-term lines from neighboring product term allocators 220(2) and 220(3) to OR gate 232.

Within macrocell 230(1), XOR MUX 234 is programmable to apply the signal on XOR MUX line 221, a logic "1", or a logic "0" to a first input terminal of XOR gate 233. OR gate 232 generates a sum-of-products term which is applied to the second input terminal of XOR gate 233. The output of XOR gate 233 is selectively transmitted through D/T flip-flop 238 and flip-flop MUX 239 as a registered output signal, or directly through flip-flop MUX 239 as a combinatorial output signal transmitted on macrocell feed forward line 241 or macrocell output line 242. The remaining P-term lines selectively provide optional control signals for D/T flip-flop 238 (when a registered output signal is generated), and/or provide optional output enable (OE) control (e.g., when the output is directed to an I/O pin 310).

Specifically, Set MUX 235 selectively passes the signal on P-term set line 222 or a global set signal (received on global set/reset line 402) to the set (S) terminal of D/T flip-flop 238. Clock MUX 236 selectively passes the signal on P-term clock line 223 or a global clock signal (received on one of the global clock lines 403) to the clock terminal of D/T flip-flop 238. Reset MUX 237 selectively passes the signal on P-term reset line 224 or a global reset signal (received on global set/reset line 402) to the reset (R) terminal of D/T flip-flop 238. Finally, as discussed above, P-term OE line 225 is directed to one of the I/O modules 300 (see also FIG. 1).

Macrocell 230(1) also includes power management circuitry that includes a NAND gate 272 having inputs to receive a power control signal VENA and an enable bit 270. For purposes of discussion herein, the signal VENA is an active low signal, although in other embodiments the signal VENA may be an active high signal. The output of NAND gate 272 is provided to a first input to AND gate 274, which has a second input to receive a product term clock enable signal and an output coupled to the clock enable terminal of D/T flip-flop 238. If enable bit 270 is set high, then macrocell 230(1) may be selectively powered down using signal VENA.

Specifically, if enable bit 270 is set high, then the output signal of NAND gate 272 is dependent on signal VENA. If signal VENA is de-asserted (e.g., to logic high), then the output signal of NAND gate 272 is high. Thus, the signal on product term clock enable line 250 is passed through AND gate 274 to the clock enable terminal of flip-flop 238. On the other hand, if signal VENA is asserted (e.g., to logic low), then the output signals of both NAND gate 272 and AND gate 274 are low, thereby disabling the clock and storing the last value of flip-flop 238. Note that if bit 270 is set low, thereby designating macrocell 230(1) as a non-power-down macrocell, then the signal on product term clock enable line 250 is always passed through AND gate 274 to the clock enable terminal of flip-flop 238.

Figure 4:
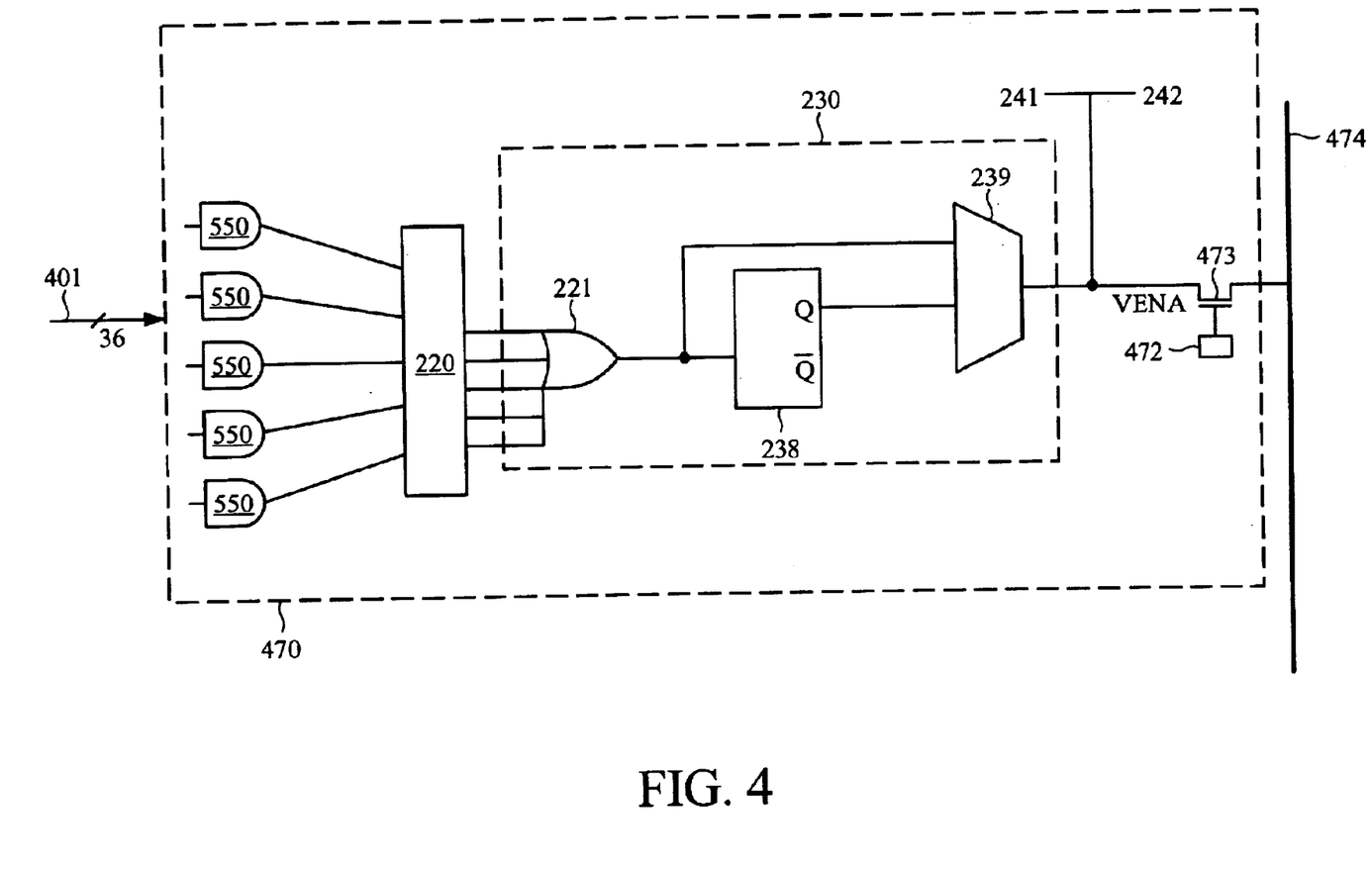
FIG. 4 is a simplified block diagram of a control function block of the PLD of FIG. 2 which generates a power control signal (VENA)

FIG. 4 shows a control function block 470 that is one embodiment of function block 200. Control function block 470 generates the VENA signal in a well-known manner using standard PLD logic (not shown) as described, for example, in U.S. Pat. No. 6,172,518, which is referenced above. Note that signal VENA can be generated using any otherwise unused portions of function block 470 including the AND array (not shown for simplicity). Alternatively, portions of multiple function blocks may be used to generate the power control signal VENA. Thus, for some embodiments, signal VENA may be a conventional logic function of several input signals 401 which may be generated within the PLD and provided to control function block 470 through macrocell feed forward lines 241 and/or imported P-terms. For other embodiments, inputs 401 may be generated entirely outside the PLD and supplied directly from input/output pins 310. For another embodiment, power control signal VENA may be generated from a combination of signals originating both internally and externally to the PLD.

For one example, signal VENA may be generated by control block 470 in response to unsuccessful attempts to access PLD 100 or a host system (not shown for simplicity) incorporating PLD 100. Thus, for some embodiments, a user of a host system such as, for example, a computer, PDA, or other device, may be prompted to enter a password to access the system. The password may be provided by the user to PLD 100 via input pins 310 and compared with a key stored within the PLD (e.g., in a memory cell or look-up table). If the entered password does not match the stored key, control block 470 may not drive the signal VENA to a de-asserted state which, as described below with respect to FIGS. 6–9, may be used to disable input pins 310 to prevent access to PLD 100 and/or the host system.

Control function block 470 also includes a master enable bit 472 that may be stored in any suitable storage element including, for example, a register, a memory cell, or the like. When asserted (e.g., to logic high), master enable bit 472 turns on transistor 473 to allow the transfer of signal VENA to VENA rail 474. Conversely, when de-asserted (e.g., to logic low), master enable bit 472 turns off transistor 473 to prevent the transfer of signal VENA to VENA rail 474.

Figure 5:
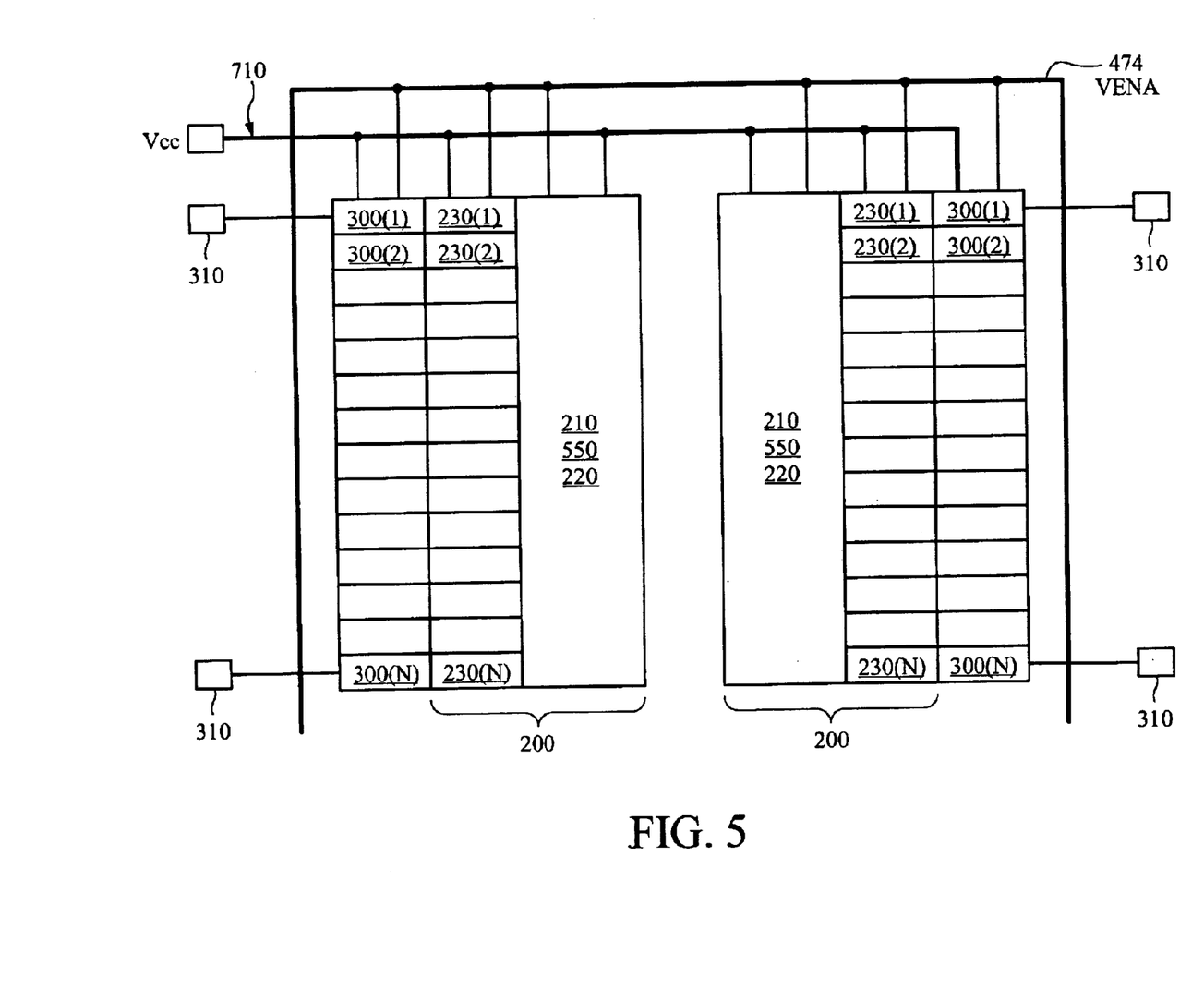
FIG. 5 is a simplified schematic representation of the distribution of the VENA rail to the function blocks and I/O modules of the PLD of FIG. 2.

Referring also FIG. 5, VENA rail 474 is coupled to all P-term buffers 550, macrocells 230, and I/O blocks 300 of the PLD. Supply voltage $V_{cc}$ rail 710 is coupled to these same elements as well as AND array 210 and product term allocators 220. For the exemplary embodiment of FIG. 5, representative function block 200 is depicted as a set of macrocells 230(1)–230(N) attached to a block representing AND array 210, P-term buffers 550, and product term allocators 220.

Figure 6:
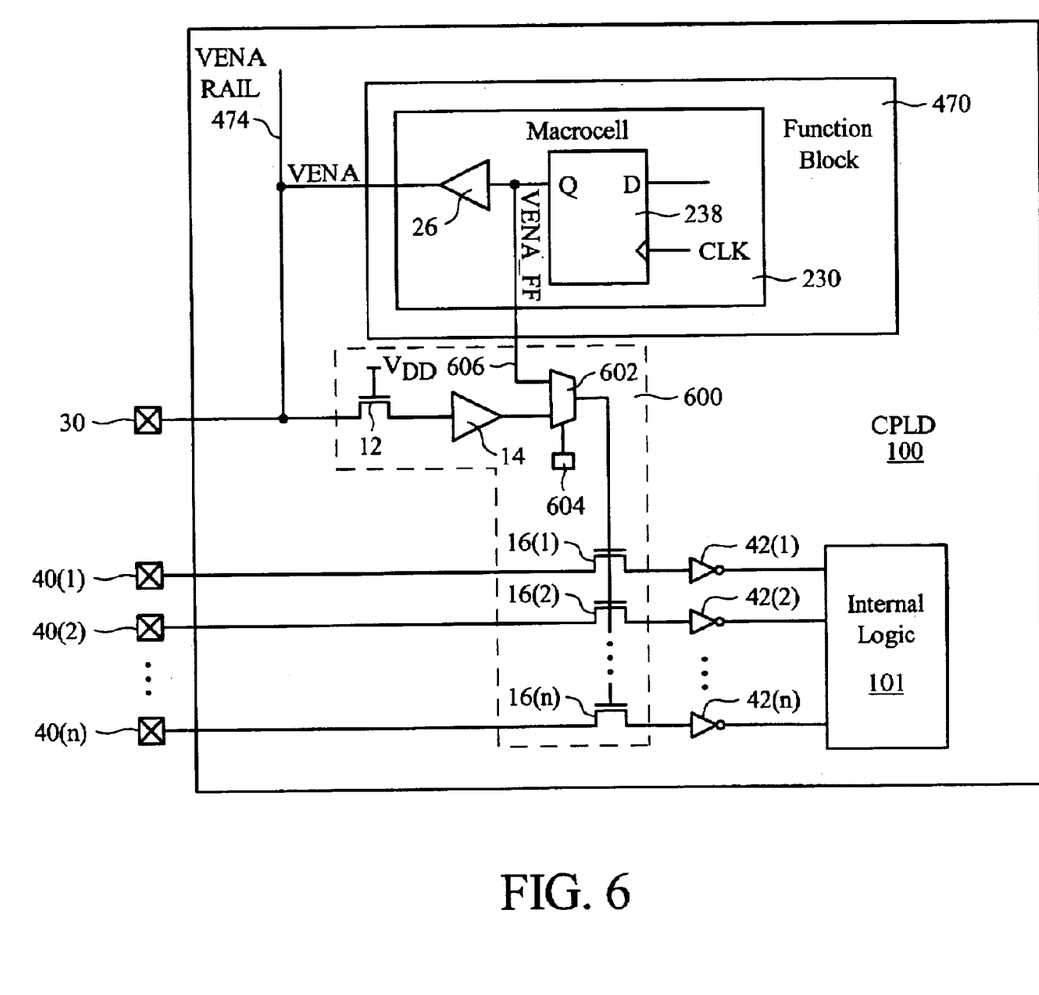
FIG. 6 is a schematic diagram of an input signal blocking circuit in accordance with one embodiment of the present invention.

FIG. 6 shows PLD 100 having an input signal blocking circuit 600 in accordance with one embodiment of the present invention. Circuit 600 is shown coupled to a control function block 470 that generates the signal VENA as described above. For simplicity, other function blocks 200, as well as I/O blocks 300 and FSM 400, are not shown in FIG. 6. Circuit 600 includes datagate 12, buffer 14, input pass transistors 16(1)–16(n), a multiplexer 602, and a select bit 604. For some embodiments, buffer 26 is implemented in multiplexer 239 of FIG. 3. A feed forward signal (VENA_FF), which mirrors the logic state of signal VENA as latched in flip-flop 238, is provided on a feed forward path 606 from the output of flip-flop 238. Multiplexer 602 has a first input to receive signal VENA_FF from feed forward path 606, a second input coupled to the output of buffer 14, an output coupled to the gates of input pass transistors 16(1)–16(n), and a control terminal to receive the select bit 604. Select bit 604 may be stored in any suitable storage device including, for example, a register, a memory cell, or the like. For some embodiments, select bit 604 is provided during PLD configuration operations from a configuration bitstream.

For some embodiments, observation pin 30 and input pins 40(1)–40(n) are I/O pins 310 of FIGS. 2 and 5. For other embodiments, observation pin 30 and input pins 40(1)–40(n) represent a subset of I/O pins 310.

Select bit 604 determines whether signal VENA from VENA rail 474 or signal VENA_FF from feed forward line 606 controls input pass transistors 16(1)–16(n). Specifically, when select bit 604 is de-asserted (e.g., to logic low), input signal blocking circuit 600 is in a non-secure mode and multiplexer 602 routes the signal VENA from VENA rail 474 via datagate 12 and buffer 14 to the gates of input pass transistors 16(1)–16(n). In this non-secure mode, the state of the VENA signal on rail 474 may be altered by a user having knowledge of observation pin 30, as described above with respect to FIG. 1. For example, a user may force an asserted VENA signal on rail 474 to a de-asserted state by externally driving observation pin 30 to logic high, thereby re-enabling input pins 40 and thus override the input pin disabling feature of PLD 100.

Conversely, when select bit 604 is asserted (e.g., to logic high), circuit 600 is in a secure mode and multiplexer 602 routes VENA_FF from feed forward path 606 to the gates of input pass transistors 16(1)–16(n). Thus, when VENA is latched logic high by flip-flop 238, VENA_FF is also logic high and turns on input pass transistors 16(1)–16(n), thereby enabling input pins 40(1)–40(n) to provide input signals to internal PLD logic 101 via buffers 42(1)–42(n), respectively. Conversely, when VENA is latched logic low by flip-flop 238, VENA_FF is also logic low and turns off input pass transistors 16(1)–16(n), thereby disabling input pins 40(1)–40(n).

Because VENA_FF is not accessible from VENA rail 474 or from observation pin 30, the state of VENA_FF cannot be externally altered via observation pin 30 when circuit 600 is in the secure mode, thereby preventing users from overriding the input pin disabling feature of PLD 100 from observation pin 30. In this manner, circuit 600 enhances the security for PLD 100, which in turn allows PLD 100 to be used in secure applications such as, for example, restricting access to PLD 100 or to a system incorporating PLD 100 when valid passwords are not provided to PLD 100. Note that the state of VENA is externally observable via observation pin 30 when circuit 600 is in either the non-secure mode or the secure mode.

Figure 7:
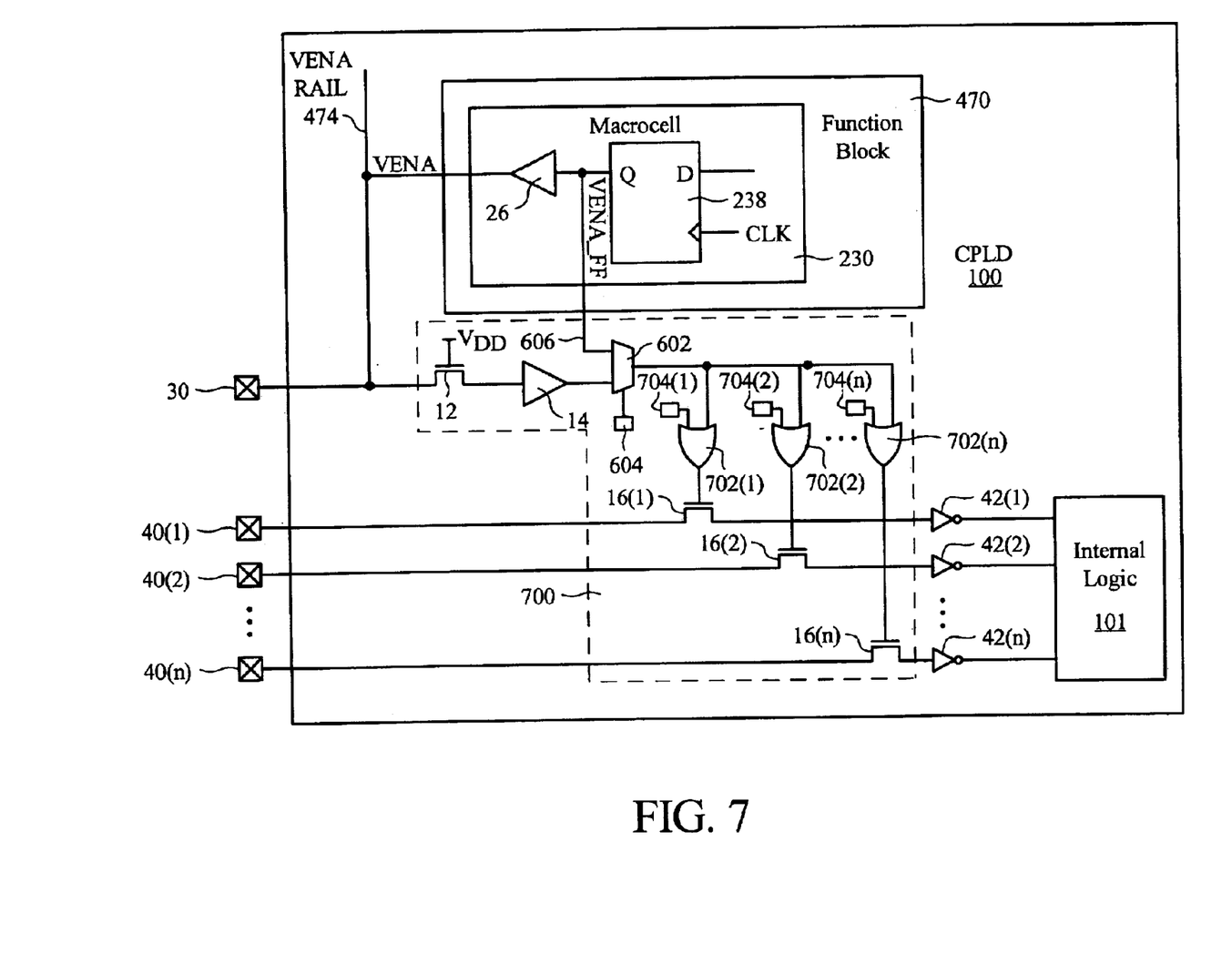
FIG. 7 is a schematic diagram of an input signal blocking circuit in accordance with another embodiment of the present invention.

FIG. 7 shows an input signal blocking circuit 700 in accordance with another embodiment of the present invention that allows signals on device input pins 40(1)–40(n) to be selectively controlled by the power control signal. In addition to the elements of circuit 600 of FIG. 6, circuit 700 includes a plurality of OR gates 702(1)–702(n) and corresponding control bits 704(1)–704(n). Each OR gate 702 includes a first input to receive VENA_FF, a second input to receive the corresponding control bit 704, and an output coupled to the gate of a corresponding input pass transistor 16. The control bits 704 may be stored in any suitable storage elements including, for example, registers, memory cells, or the like. For some embodiments, the control bits 704 may be provided during PLD configuration from the configuration bitstream.

If a control bit 704 is de-asserted (e.g., to logic low), then the corresponding input pass transistor 16 (and thus the enabling or disabling of the corresponding input pin 40) is controlled by the state of VENA. For example, if control bit 704(1) is de-asserted to logic low and VENA is asserted to logic low, then OR gate 702(1) outputs a logic low signal to turn off input pass transistor 16(1), thereby disabling input pin 40(1). However, if VENA is de-asserted (e.g., to logic high), then OR gate 702(1) outputs a logic high signal to turn on input pass transistor 16(1), thereby enabling input pin 40(1).

Conversely, if a control bit 704 is asserted (e.g., to logic high), then the corresponding input pass transistor 16 remains in a conductive state to enable the corresponding input pin 40, irrespective of VENA. Thus, for example, if control bit 704(1) is asserted to logic high, then OR gate 702(1) outputs a logic high signal to turn on input pass transistor 16(1), irrespective of VENA.

Figure 8:
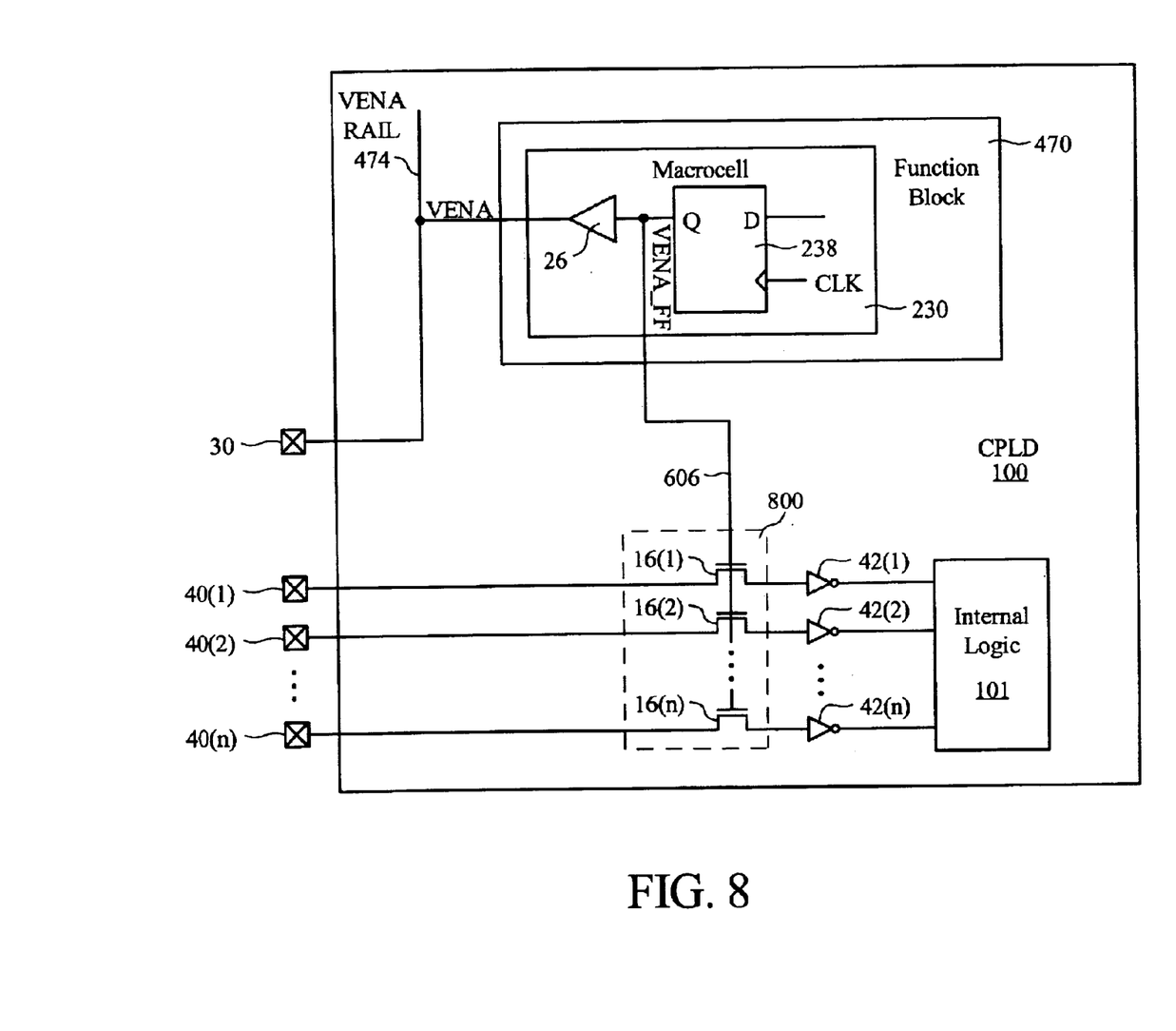
FIG. 8 is a schematic diagram of an input signal blocking circuit in accordance with yet another embodiment of the present invention.

For other applications, it may not be desirable for PLD 100 to have both a secure mode and a non-secure mode, but rather for PLD 100 to have only a secure mode in which VENA cannot be externally altered from observation pin 30. FIG. 8 shows an input signal blocking circuit 800 in accordance with another embodiment of the present invention. Circuit 800 receives the feed forward signal VENA_FF from feed forward path 606 and applies VENA_FF to the gates of input pass transistors 16(1)–16(n) to selectively disable input pins 40(1)–40(n), respectively. Because feed forward path 606 is not accessible from observation pin 30, VENA_FF cannot be externally altered from observation pin 30.

Figure 9:
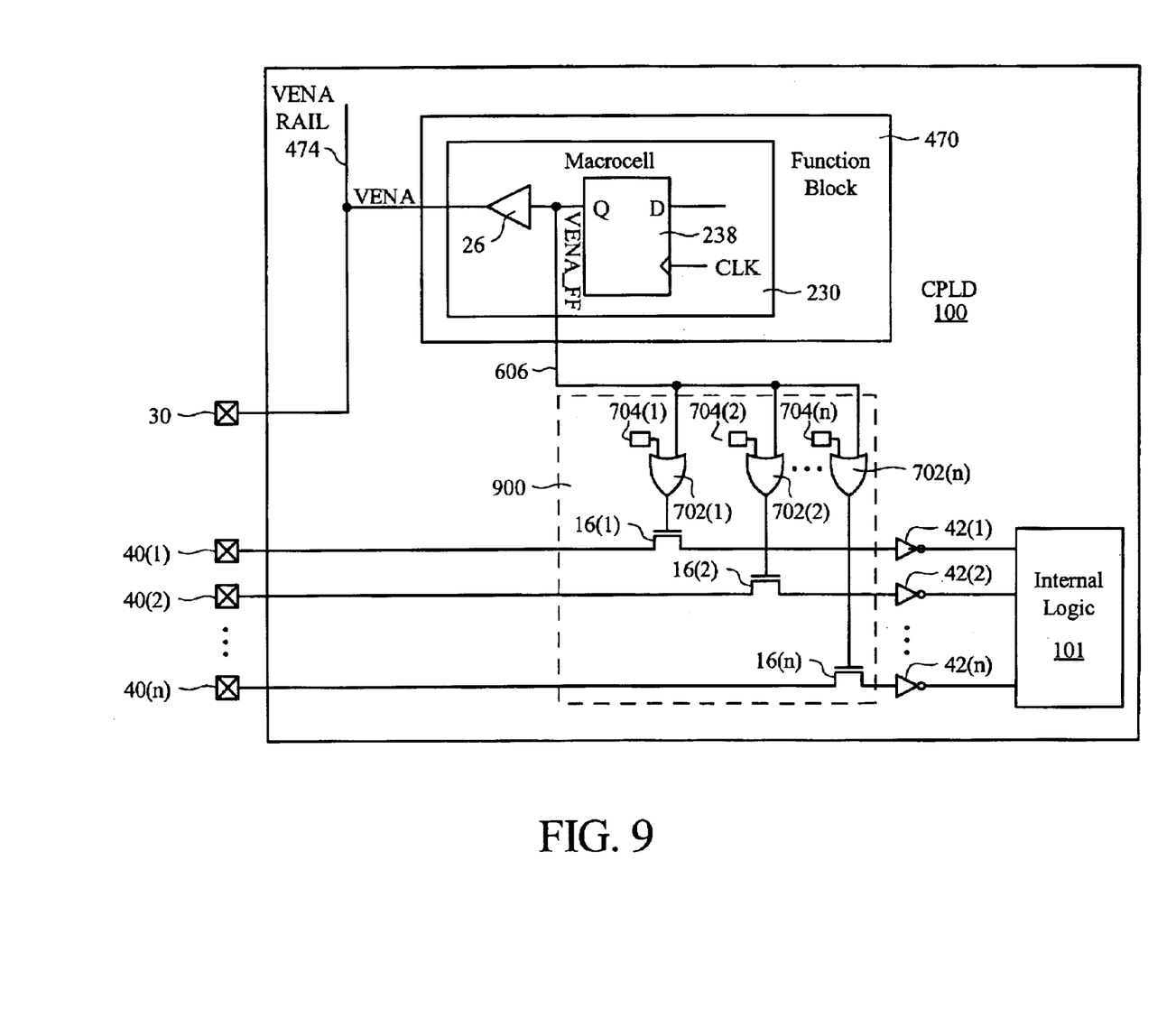
FIG. 9 is a schematic diagram of an input signal blocking circuit in accordance with still another embodiment of the present invention.

FIG. 9 shows an input signal blocking circuit 900 in accordance with another embodiment of the present invention that allows device input pins 40(1)–40(n) to be selectively controlled by VENA_FF. Circuit 900 is similar to circuit 800 of FIG. 8, with the addition of OR gates 702(1)702(n) and corresponding control bits 704(1)–704(n). Operation of OR gates 702(1)–702(n) and corresponding control bits 704(1)–704(n) in allowing VENA_FF to enable or disable selected input pins 40(1)–40(n) is described above with respect to FIG. 7, and therefore is not repeated again here.

Note that because circuits 800 and 900 include fewer elements than circuits 600 and 700, respectively, circuits 800 and 900 consume less silicon area than circuits 600 and 700, respectively, which may be advantageous in reducing circuit size and cost.

Figure 10:
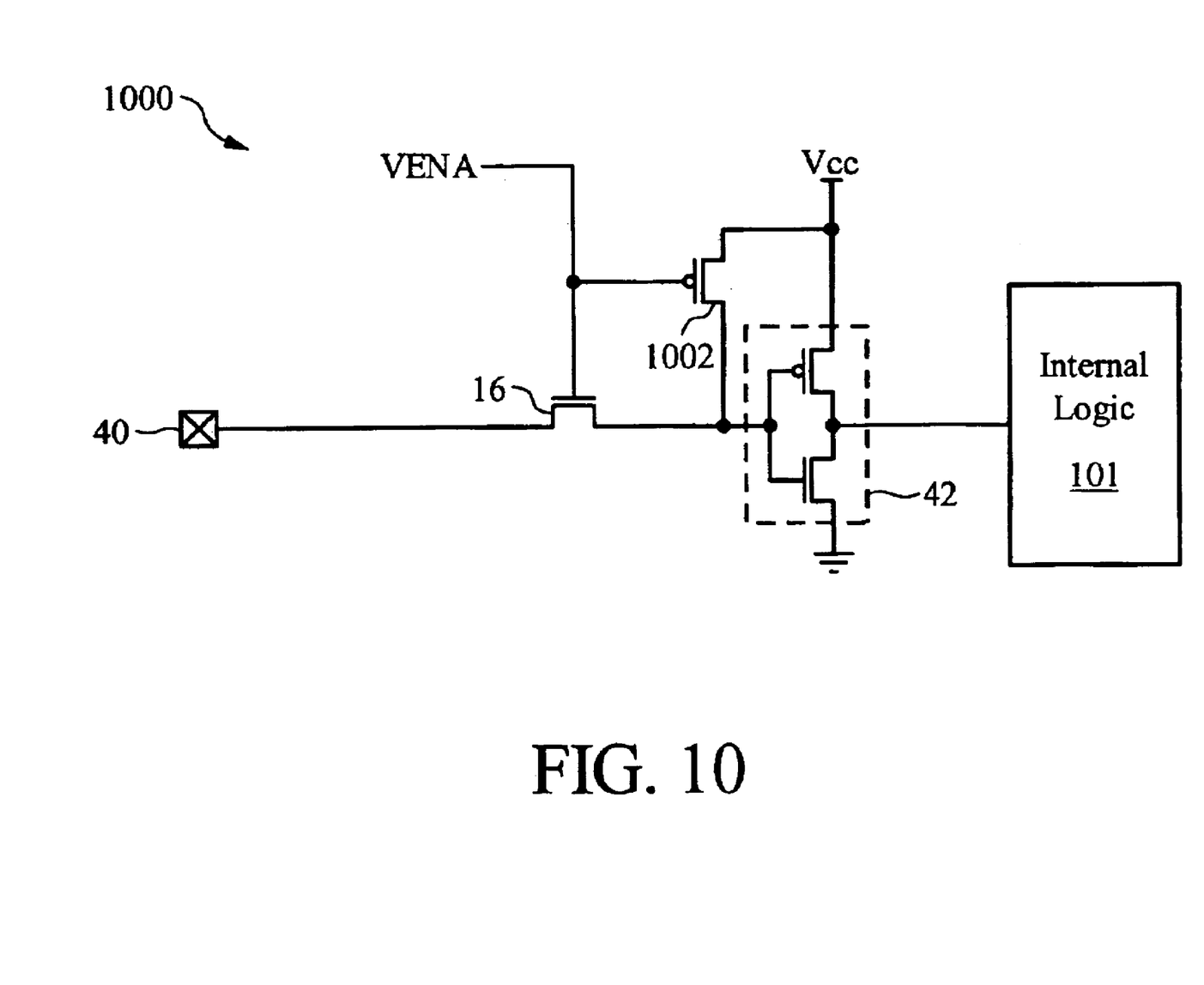
FIG. 10 is a schematic diagram of a circuit that may be used with various embodiments of the input signal blocking circuit of the present invention to force selected input pins to a static state.

FIG. 10 shows a VENA control circuit 1000 that may be used with input signal blocking circuits 600, 700, 800, and 900 to force circuits driven by input pins 40 to a logic low state when VENA is asserted. Circuit 100 includes NMOS input pass transistor 16, CMOS inverter 42, and a PMOS transistor 1002. The signal VENA is coupled to the gate of input pass transistor 16 and to the gate of PMOS transistor 1002, which is coupled between $V_{cc}$ and the input of inverter 42. The output of inverter 42 is routed to internal PLD logic 101.

For example, when signal VENA is asserted to logic low, NMOS transistor 16 turns off and PMOS transistor 1002 turns on. The non-conductive input pass transistor 16 disables input pin 40 (as described above), and the conductive transistor 1002 pulls the input of inverter 42 to logic high ($V_{cc}$), which in turn forces the output of inverter 42 to a logic low state. Conversely, when signal VENA is deasserted to logic high, PMOS transistor 1002 turns off and NMOS transistor 16 turns on. The non-conductive transistor isolates the input of inverter 42 from $V_{cc}$, and the conductive input pass transistor 16 allows signals on input pin 40 to pass to internal PLD logic 101 inverter 42.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An apparatus for disabling a plurality of input pins of a programmable logic device (PLD), comprising:
    means for generating a power control signal;
    a distributed rail to route the power control signal throughout the PLD;
    an observation pin connected to the distributed rail, the power control signal externally observable via the observation pin;
    a feed forward signal indicative of the logic state of the power control signal, the feed forward signal not being alterable from the observation pin; and
    an input signal blocking circuit coupled to the input pins, the input signal blocking circuit for selectively disabling the input pins in response to the feed forward signal.

2. The apparatus of claim 1, wherein assertion of the power control signal disables response to the input pins via the feed forward signal.

3. The apparatus of claim 1, wherein de-assertion of the power control signal enables response to the input pins via the feed forward signal.

4. The apparatus of claim 1, wherein the input signal blocking circuit comprises:
    a plurality of input pass transistors, each coupled between a corresponding input pin and internal logic of the PLD and having a gate to receive the feed forward signal.

5. The apparatus of claim 4, wherein the input signal blocking circuit further comprises:
    means for selectively providing the feed forward signal to each of the input pass transistors.

6. The apparatus of claim 5, wherein the means for selectively providing comprises:
    a plurality of control bits; and
    a plurality of logic gates, each having a first input to receive the feed forward signal, a second input to receive a corresponding control bit, and an output coupled to the gate of a corresponding input pass transistor.

7. The apparatus of claim 1, wherein the input signal blocking circuit further comprises:
    a multiplexer having a first input to receive the feed forward signal, a second input to receive the power control signal from the distributed rail, an output coupled to the gates of the input pass transistors, and a control terminal to receive a select bit.

8. The apparatus of claim 7, wherein the input signal blocking circuit further comprises:
    a plurality of control bits; and
    a plurality of logic gates, each having a first input to receive the feed forward signal, a second input to receive a corresponding control bit, and an output coupled to the gate of a corresponding input pass transistor.

9. The apparatus of claim 8, wherein the logic gates comprise OR gates.

10. The apparatus of claim 1, wherein the means for generating comprises a function block of the PLD.

11. The apparatus of claim 10, wherein the function block de-asserts the power control signal to enable the input pins in response to a user entering a valid password to the PLD.

12. An apparatus for disabling a plurality of input pins of a programmable logic device (PLD), comprising:
    at least one configurable block, comprising:
        control logic for generating a power control signal;
        a flip-flop having an input to receive the power control signal from the control logic; and
        a buffer having an input connected to an output of the flip-flop;
    a power control rail coupled to an output of the buffer for distributing the power control signal throughout the PLD;
    an observation pin connected to the power control rail, the observation pin for allowing external observation of the power control signal;
    a plurality of input pass transistors, each having a gate and coupled between a corresponding input pin and internal logic of the PLD; and
    a feed forward path connected between the output of the flip-flop and the gates of the input pass transistors, the feed forward path providing a logic state of the power control signal as a feed forward signal to the input pass transistors.

13. The apparatus of claim 12, wherein assertion of the power control signal disables response to the input pins.

14. The apparatus of claim 12, wherein de-assertion of the power control signal enables response to the input pins.

15. The apparatus of claim 12, wherein the input pass transistors do not receive the power control signal from the power control rail.

16. The apparatus of claim 12, wherein the feed forward path is not accessible from the observation pin.

17. The apparatus of claim 12, further comprising:
    a plurality of control bits; and
    a plurality of logic gates, each having a first input coupled to the feed forward path, a second input to receive a corresponding control bit, and an output coupled to the gate of a corresponding input pass transistor.

18. The apparatus of claim 17, wherein the logic gates comprise OR gates.

19. The apparatus of claim 17, wherein assertion of one of the control bits enables a corresponding input pin, irrespective of the power control signal.

20. The apparatus of claim 18, wherein de-assertion of one of the control bits allows the power control signal to selectively disable a corresponding input pin via the feed forward path.

21. The apparatus of claim 17, further comprising:
    a multiplexer having a first input coupled to the feed forward path, a second input coupled to the power control rail, an output coupled to the gates of the input pass transistors, and a control terminal to receive a select bit.

22. The apparatus of claim 21, wherein the select bit is provided by a configuration bitstream.

23. The apparatus of claim 21, wherein an asserted select bit couples the feed forward path to the input pass transistors and isolates the power control rail from the input pass transistors.

24. The apparatus of claim 21, wherein a de-asserted select bit isolates the feed forward path from the input pass transistors and couples the power control rail to the input pass transistor.

25. The apparatus of claim 21, further comprising:
a plurality of control bits; and
a plurality of logic gates, each having a first input coupled to the output of the multiplexer, a second input to receive a corresponding control bit, and an output coupled to the gate of a corresponding input pass transistor.

26. The apparatus of claim 25, wherein the logic gates comprise OR gates.

27. The apparatus of claim 26, wherein assertion of the control bit enables a corresponding input pin, irrespective of the power control signal.

28. The apparatus of claim 26, wherein de-assertion of the control bit allows the multiplexer output to selectively disable a corresponding input pin.

29. The apparatus of claim 12, wherein the control logic comprises:
an AND array having inputs to receive control signals and having outputs to provide a plurality of product terms; and
an OR array having inputs selectively coupled to the outputs of the AND array, the OR array generating a sum-of-products term which comprises the power control signal.

30. The apparatus of claim 29, wherein the control logic de-asserts the power control signal in response to a valid password.

31. A method of restricting access to a programmable logic device (PLD) including a plurality of device input pins, the method comprising:
generating a power control signal;
providing the power control signal to a distributed rail that is externally observable from a device observation pin;
providing the power control signal as a feed forward signal to an input signal blocking circuit; and
selectively disabling the device input pins in response to the feed forward signal.

32. The method of claim 31, wherein the power control signal is de-asserted to enable response to the device input pins in response to an entry of a valid password.

33. The method of claim 31, further comprising:
selectively providing the power control signal on one of the rail and the feed forward signal to the input signal blocking circuit.

34. The method of claim 31, further comprising:
gating the feed forward signal in a plurality of logic gates with a corresponding plurality of control bits, each control bit corresponding to one of the device input pins.

35. The method of claim 31, wherein the feed forward signal is not alterable from the observation pin.

* * * * *